(12) United States Patent
Johnson

(10) Patent No.: US 8,284,617 B2
(45) Date of Patent: Oct. 9, 2012

(54) CIRCUITS, DEVICES, SYSTEMS, AND METHODS OF OPERATION FOR CAPTURING DATA SIGNALS

(75) Inventor: James Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/438,756

(22) Filed: Apr. 3, 2012

(65) Prior Publication Data

US 2012/0188829 A1 Jul. 26, 2012

Related U.S. Application Data

(62) Division of application No. 12/852,325, filed on Aug. 6, 2010, now Pat. No. 8,154,931, which is a division of application No. 12/070,947, filed on Feb. 21, 2008, now Pat. No. 7,787,310.

(51) Int. Cl.
*G11C 7/00* (2006.01)

(52) U.S. Cl. .................. 365/189.02; 365/193; 365/191

(58) Field of Classification Search .......... 365/189.02, 365/193, 191, 189.05, 230.03, 230.02, 230.08, 365/189.09, 200, 189.01
See application file for complete search history.

(56) References Cited

U.S. PATENT DOCUMENTS

| 6,240,046 | B1 * | 5/2001 | Proebsting | 365/233.17 |
|---|---|---|---|---|
| 6,333,875 | B1 | 12/2001 | Shinozaki | |
| 6,438,066 | B1 * | 8/2002 | Ooishi et al. | 365/233.13 |
| 7,082,071 | B2 | 7/2006 | Knaack et al. | |
| 7,787,310 | B2 | 8/2010 | Johnson | |
| 2004/0184308 | A1 | 9/2004 | Kim et al. | |
| 2006/0171236 | A1 | 8/2006 | Atwood et al. | |
| 2008/0080267 | A1 | 4/2008 | Lee | |
| 2010/0315885 | A1 | 12/2010 | Johnson | |

* cited by examiner

*Primary Examiner* — Dang Nguyen
(74) *Attorney, Agent, or Firm* — Dorsey & Whitney LLP

(57) ABSTRACT

Embodiments of the invention describe driving data onto a bus. The embodiments include a data driver circuit having a data capture circuit coupled to the bus. The data capture circuit receives data relative to a write strobe signal and captures a first digit of the data responsive to a first edge of the write strobe signal and at least a second digit responsive to a second edge of the write strobe signal. The data driver circuit includes a feedback capture circuit that captures each digit in substantially the same manner as the data capture circuit, and generates a latch control signal indicative of when each digit is latched. The latch control signal is provided to a write control circuit that determines which digit was latched first relative to a timing, and generates a select control signal to drive captured digits onto the bus in the order the digits were received.

20 Claims, 9 Drawing Sheets

US 8,284,617 B2

CIRCUITS, DEVICES, SYSTEMS, AND METHODS OF OPERATION FOR CAPTURING DATA SIGNALS

CROSS-REFERENCE TO RELATED APPLICATION

This application is a divisional of pending U.S. patent application Ser. No. 12/852,325, filed Aug. 6, 2010, which application is a divisional of U.S. patent application Ser. No. 12/070,947, filed Feb. 21, 2008 and issued as U.S. Pat. No. 7,787,310. These applications and patent are incorporated herein by reference, in their entirety, for any purpose.

TECHNICAL FIELD

Embodiments of the present invention relate generally to integrated circuit devices, and more specifically, to tracking signal alignment between an internally generated write strobe and an external clock during write data capture.

BACKGROUND

Clock signals are typically used to establish the timing of a digital signal or the timing at which an operation is performed on a digital signal. For example, data signals are typically coupled to and from memory devices, such as synchronous dynamic random access memory ("SDRAM") devices, in synchronism with an internal clock signal such as a data strobe signal. A write strobe signal, during a write data operation, typically has a phase that is aligned with a system clock signal. The write strobe signal may be generated by the memory controller derived from the system clock signal, and is applied to the memory device into which the data are being written. Write data signals are conventionally applied in synchronism with the write strobe signal. For example, the write data signals are captured responsive to the write strobe signal transitions between two logic states during a "data eye" occurring at the center of the period in which the write data signals are valid. The write strobe signal can therefore be used by a memory device to capture the write data when the data are valid.

As the speed of memory devices continue to increase, the timing of write strobe signals relative to the tracking and timing of the data signals has become even more critical. Conventional write latency tracking systems may utilize frequency dividers to generate multi-phase write strobe signals that may be used to track the data signals and alleviate some of the timing constraints. The write strobe signal may be issued intermittently by the memory controller in the form of burst data during a write operation. Data bits (also referred to as digits) initially collected from a high-speed serial link during a write operation may be deserialized to reduce the frequency at which the data bits are provided for better handling of the data by the DRAM device. Thus, the use of multi-phase strobe signals allow for a larger bandwidth and increased timing margin as more data may be captured at a faster rate.

The problem with conventional write latency tracking systems that employ frequency dividers is that synchronization between the system clock and the write strobe signal is not easily attained due to the write strobe signal being discontinuous while the system clock is continuous. Utilizing synchronous dividers may simplify frequency division and write strobe signal distribution, but it also results in an indeterministic phase sequence between the continuous system clock and the discontinuous divided write strobe signals. The problem is exacerbated by write strobe preamble transitions necessary for non-consecutive write commands, which may cause further tracking misalignment. Consequently, a difficulty with using the multi-phase write strobe has been with tracking the correct data and aligning the data between the frequency divided strobe signals and the system clock. Other factors, such as statistical variations in transistor characteristics, voltage gradients across the integrated circuit die, and data dependent switching noises may contribute to timing problems and may cause significant delay mismatch in nominally matched circuit paths.

There is, therefore, a need in the art for a write latency tracking system that tracks the timing of when data arrives and captures the data relative to a discontinuous write strobe signal.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring embodiments of the invention.

Figure 1:
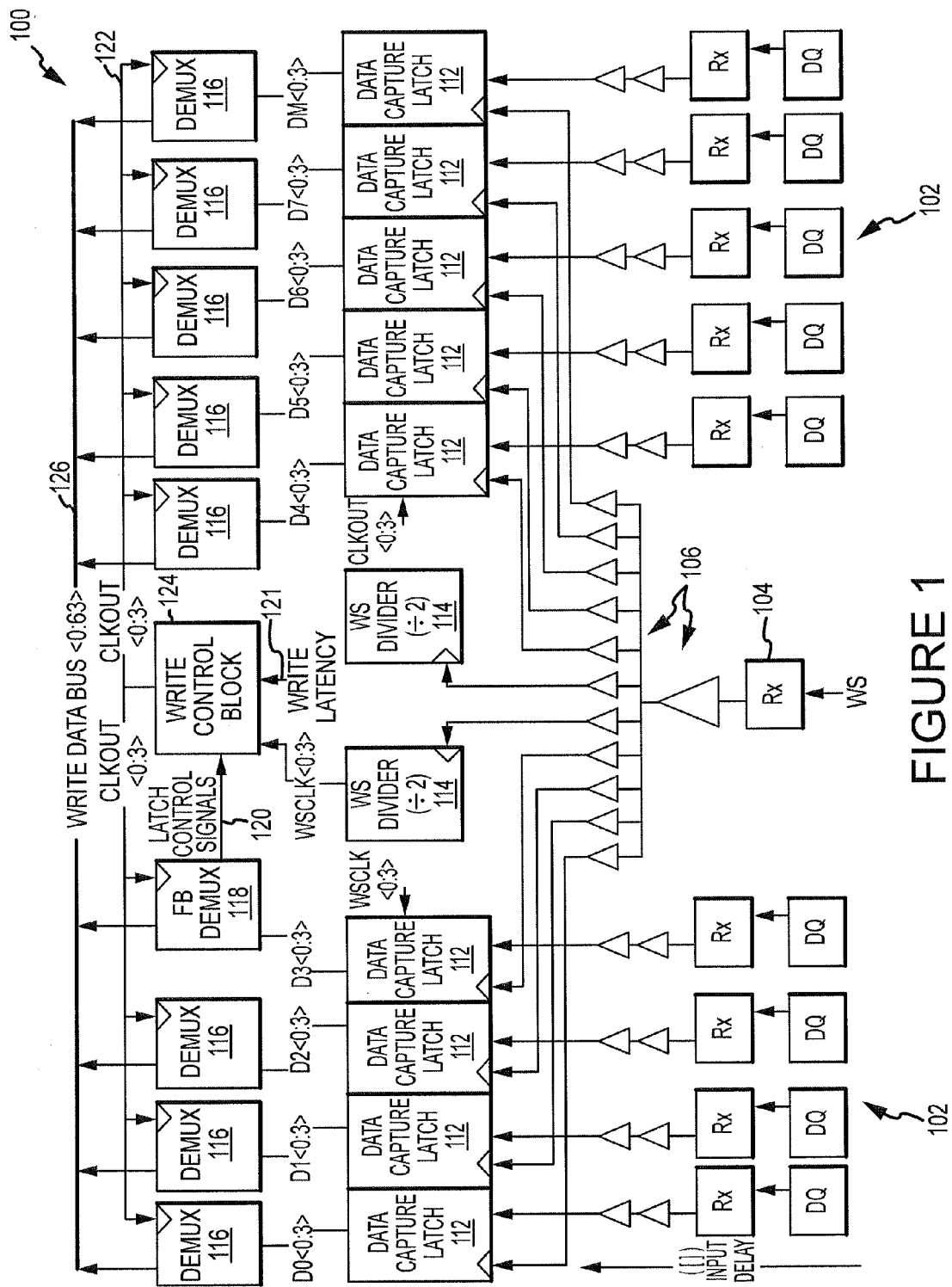
FIG. 1 is a simplified block diagram showing a write latency tracking system according to an embodiment of the invention.

FIG. 1 shows a simplified block diagram of a write latency tracking system 100 that utilizes a write strobe ("WS") signal to capture write data as it arrives onto a plurality of DQ pads. The write latency tracking system 100 includes, as one example for illustration purposes, nine DQ pads used to drive a 72 bit write data bus 126. Write data is routed from the DQ pads to data capture latches 112 through input delay paths 102. The input delay paths 102 include a plurality of receivers that are respectively coupled to receive write data from the DQ pads and a plurality of buffers that couple the receivers to the data capture latches 112. Similarly, the WS signal is received by a receiver 104 coupled to a plurality of buffers 106 that are used to fan out the WS signal to each of the data capture latches 112. The delay due to the input delay paths 102, as write data is routed from the DQ pads to the data capture latches 112, is ideally matched by each of the fanned WS signal routed to each of the data capture latches 112.

The WS signal is also propagated to a pair of clock dividers 114 that divide the WS signal into two sets of multi-phase clocks. One set of the multi-phase clocks wsclk<0:3> is provided to the data capture latches 112, and the other set wsclk<0:3> is provided to a write control block 124 that further distributes the multi-phase clock signals to each of the plurality of demux control circuits 116. In the example provided, the DQ pads receive 4-bit burst data, with each bit in the burst being sequentially captured by the corresponding data capture latch 112. Therefore, for illustration purposes, the WS signal is divided into four-phase clock sets. Thus, each of the demux control circuits 116 sequentially latches each bit and tracks when the bits are latched relative to the four-phase clock signals.

One of the demux control circuits 116 may be designated the feedback demux circuit 118, which generates latch control signals 120 provided to the write control block 124. The latch control signals 120 are generated responsive to each bit being captured and indicate when each of the bits has been latched by the demux control circuits 116. The write control block 124 includes circuitry to determine when the last bit in the 4-bit burst data has been latched relative to the four-phase clock. Thus, the latch control signals 120 indicate the location of data in the pipeline. The write control block 124 then drives the demux control circuits 116 to place the latched data bits onto the write data bus 126 relative to a write latency signal 121 that may have timing requirements from an external controller or processor (not shown). Therefore, the write latency tracking system 100 is capable of evaluating the internal write strobe and write data arrival to synchronize driving the fully captured data relative to external timing requirements.

It will be appreciated that although the previously described embodiments were described with respect to the write latency tracking system 100 driving a 72-bit data bus, embodiments of the present invention can be also used for systems designed for any bandwidth, where applicable, without departing from the scope of the embodiments of the present invention. Those ordinarily skilled in the art will obtain sufficient understanding from the description provided herein to make such modifications as needed to practice embodiments of the present invention as applied to other write data capturing and tracking systems. It will be further appreciated that the number of DQ pads, the size of the data bus, the number/speed of data signals or clock phases described are not intended to limit the invention to the particular embodiment. Those ordinarily skilled in the art will appreciate that such details can be modified by those skilled in the art without departing from the scope of the embodiments of the present invention. The data capture latches 112, the demux control logic circuits 116 and the write control block 124 will now be further described in detail.

Figure 2B:
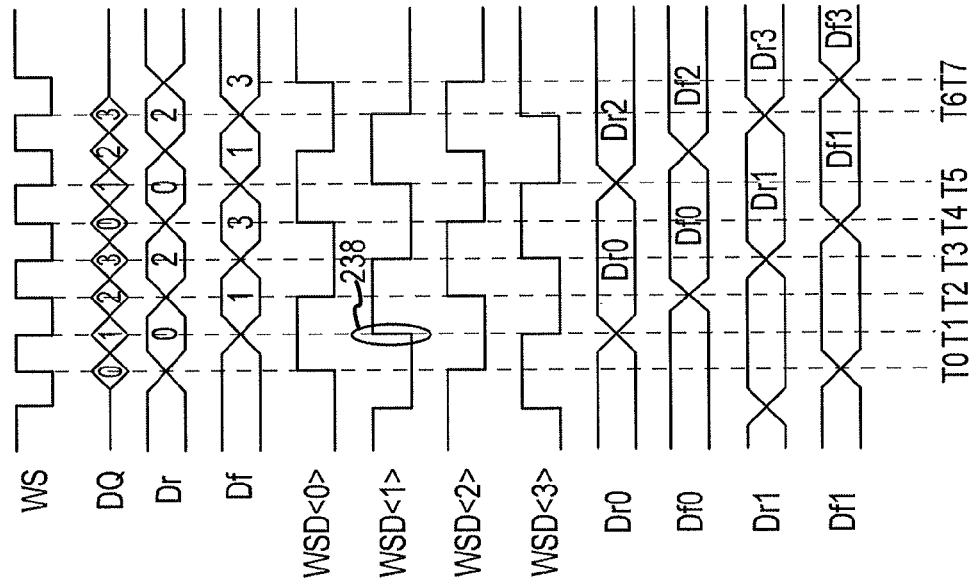
FIG. 2B is a signal diagram showing the operation of the data capture latch block of FIG. 2A.
Figure 2A:
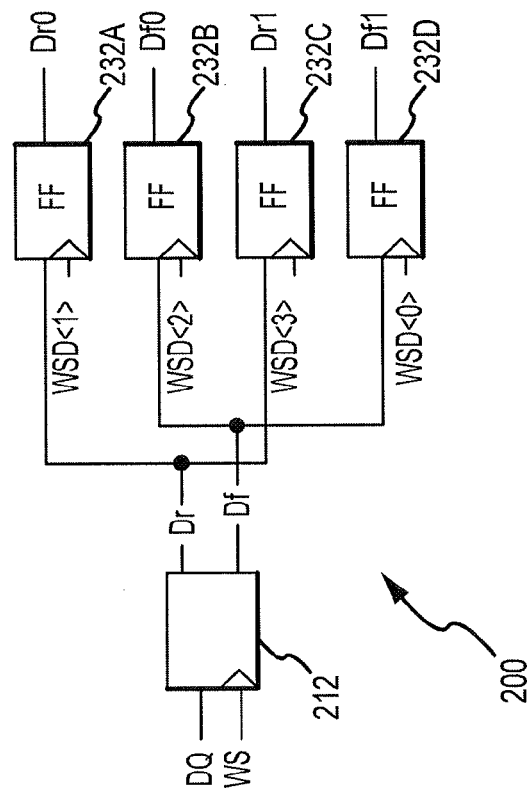
FIG. 2A is a block diagram of a data capture latch block of FIG. 1, according to an embodiment of the invention.

FIG. 2A is a block diagram of one of the data capture latches 112 of FIG. 1. Each data capture latch 112 includes a latch 212 having outputs Dr, Df coupled to a respective pair of flip flops 232A-D. The latch 212 is configured to receive both a data signal DQ and the WS signal to latch the DQ relative to the WS signal. The latch 212 splits the received data into a rising-edge captured data Dr and a falling-edge captured data Df. This causes the data valid time to increase from half a clock cycle to one full clock cycle for each of the Dr, Df signals. As previously described each of the data capture latches 112 receives the divided four-phase clock signals generated by the clock dividers 114. Each of the four-phase clocks WSD<0:3> are received by one of the flip flops 232A-D to capture data from the latch 212. Thus, the flip flops 232A-D further phase split the received Dr, Df signals, responsive to the WSD<0:3> clocks to expand the data valid time so that four bits of data Dr0, Df0, Dr1 and Df1 are captured relative to the WSD<0:3> clocks.

The operation of the data capture latch 112 may be described with reference to the signal diagram shown in FIG. 2B. At time T0, the first data bit "0" of a first burst data is latched by the latch 212 on the rising edge of the WS signal. At time T1, the first data bit becomes valid as Dr, and the data valid time is increased to a full clock cycle between times T0 to T2. The first bit latched by the latch 212 is subsequently captured while it is valid and at the next available rising edge 238 of the respective divided WS signals WSD<1> received by the corresponding flip-flop 232A. The flip-flop 232A captures the first data bit Dr0 and further increases the data valid time to two clock cycles between times T1 to T5.

Referring to time T1 again, the second data bit "1" is latched responsive to the next falling edge of the WS signal. The remaining bits in the first data burst are sequentially latched by the latch 212 at each consecutive rising and falling edges of the WS signal until the next data burst is received, indicated by the "0" bit received at time T4. The next data bit is made valid by the latch 212 at the next rising edge of the divided WS signals WSD<2> such that the flip-flop 232B captures the second data bit DID starting at time T2. Similarly, at time T3 the next available bit is latched by the flip-flop 232C responsive to the WSD<3> signal until the final data bit of the first burst data is captured at time T4 by the flip-flop 232D responsive to the rising edge of the WSD<0> signal. The operation is repeated for the next burst data that is received at time T4, where the last data bit 3 is first latched by the latch 212 at time T6 and captured by the flip-flop 232D at time T7.

Figure 3A:
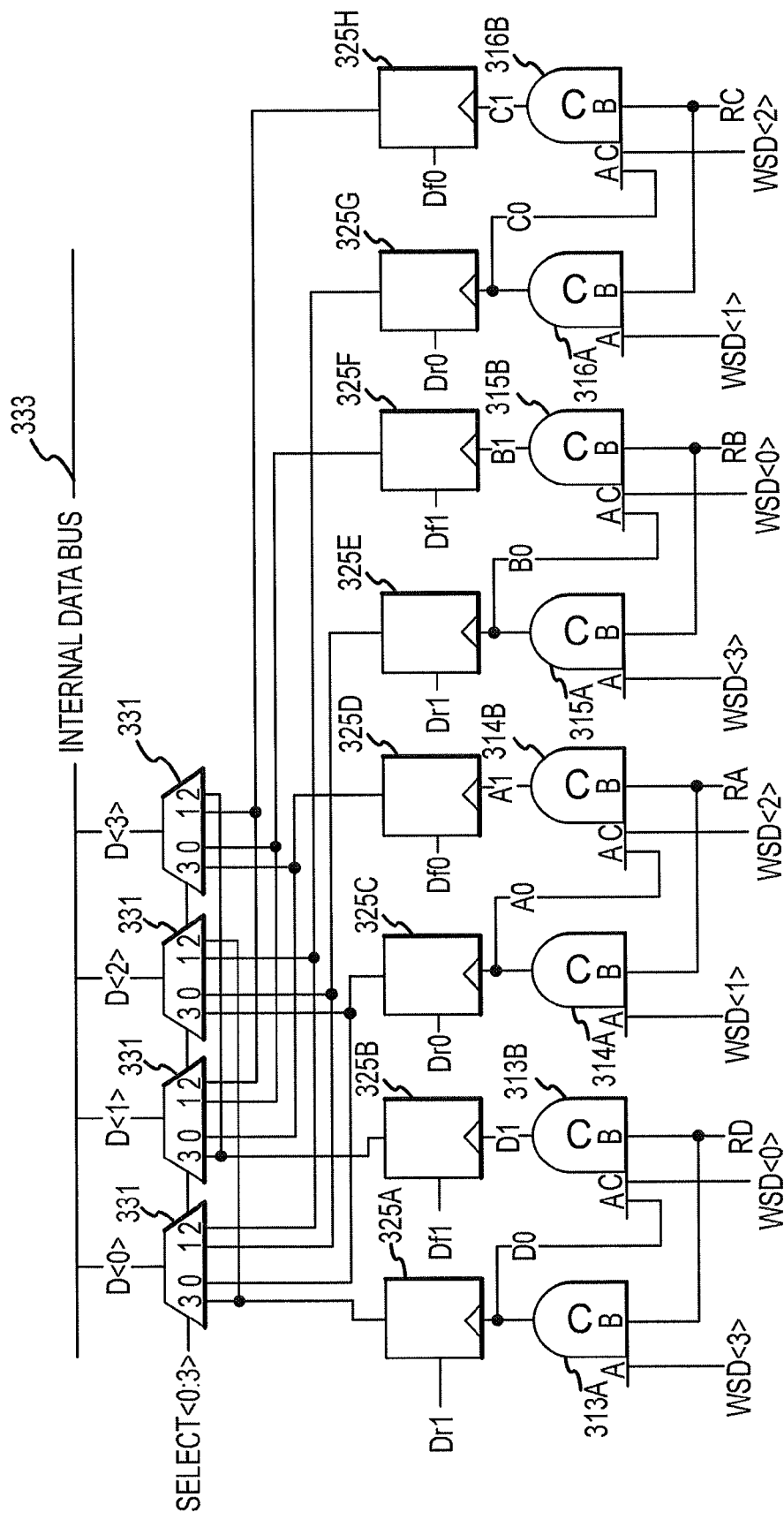
FIG. 3A is a schematic diagram of a write data demultiplexer circuit of FIG. 1 according to an embodiment.

The data that is latched by the flip-flops 232A-D of the data capture latches 112 are distributed to corresponding demux circuits 116, through which the data is driven onto the write data bus 126. FIG. 3A shows an example of one of the demux circuits 116 in greater detail. In the example provided, the demux circuit 300 includes eight latches 325A-H controlled by four latch controller pairs 313A,B-316A,B, which are Muller gate pairs. Each of the latch controller pairs 313-316 control when the correspondingly coupled latch 325A-H captures the data from the respective data capture latch 112 relative to the received WSD <0:3> signal. The latches 325A-H are additionally coupled to four 4:1 multiplexers 331 whose operation is controlled by the write control block 124, as will be described later, to drive the latched data onto the write data bus.

Muller gates conventionally change logic output states when a respective particular set of states is present on the input. Thus, the inputs of the Muller gates 313-316 of the demux circuit 116 are initially set to high. When the inputs of the Muller gates 313-316 are high, the data latches 325 are enabled to allow data to pass through, but data is not latched. The inputs of the Muller gates 313-316 transition low when data has been received from the data capture latches 112, the operation of which, as will be described later, is sequenced by a combination of the WSD <0:3> signals and the generation of reset signals RA-RD when data is latched by the data capture latches 112. The outputs of the Muller gates 313-316 change states and transition low responsive to the inputs of the Muller gates 313-316 transitioning low, which causes the respectively coupled latch 325 to close and capture the data present in the latch 325. The Muller gates 313-316, thus, operate to close each of the latches 325 responsive to the input of the Muller gates 313-316 transitioning from high to low.

Furthermore, the Muller gates 313-316 may be designed to capture data and close the respectively coupled latch 325 in succession relative to the WSD <0:3> signals. As the data bits are sequentially captured responsive to the rising and falling edges of the WS signal, the Muller gate 314A, for example, may capture the first rising edge data Dr0. The next consecutive Muller gate 314B receives and captures the next falling edge data Df0 responsive to the preceding Muller gate 314A closing. In the same manner, the next two data bits received relative to the next rising and falling edges of the WS signal, in a four-bit burst data, are sequentially captured by the next consecutive pair of Muller gates 315A,B. It will be appreciated that the first available rising edge data bit may be captured by any of the latches 325 designed to capture data on the rising edge, such as latches 325A, C, E, G, so that capture of the bits in a given data burst may initiate at any one of the rising edge latches 325A, C, E, G. It will also be appreciated that the number of latches 325 in the demux circuit 116 may be greater or less than eight, and may be designed to receive data bursts greater than or less than four bits. Those ordinarily skilled in the art will obtain sufficient understanding from the description provided herein to make such modifications as needed to practice embodiments of the present invention as applied to a different number of latches 325 in the demux circuit 116 and to accommodate different sizes of the data burst.

Each of the Muller gates 314-316 additionally receive the reset signal RA-RD for tracking when the data in the data capture latch 112 is available to the demux circuit 116. The RA-RD reset signals are generated by a demux reset circuit 340 in the write control block 124, shown in FIG. 3B. The demux reset circuit 340 generates each of the reset signals RA-RD, as a pulse, responsive to the WSD <0:3> signals, and are provided to indicate when to transition the Muller gate 313-316 output to high after a latch operation is complete to prepare the corresponding latch 325 for the next data capture. The reset signals RA-RD may additionally be designed to reset one set of Muller gates 314-316 while another set is capturing data in anticipation of the next data burst.

Figures 3B, 3C:
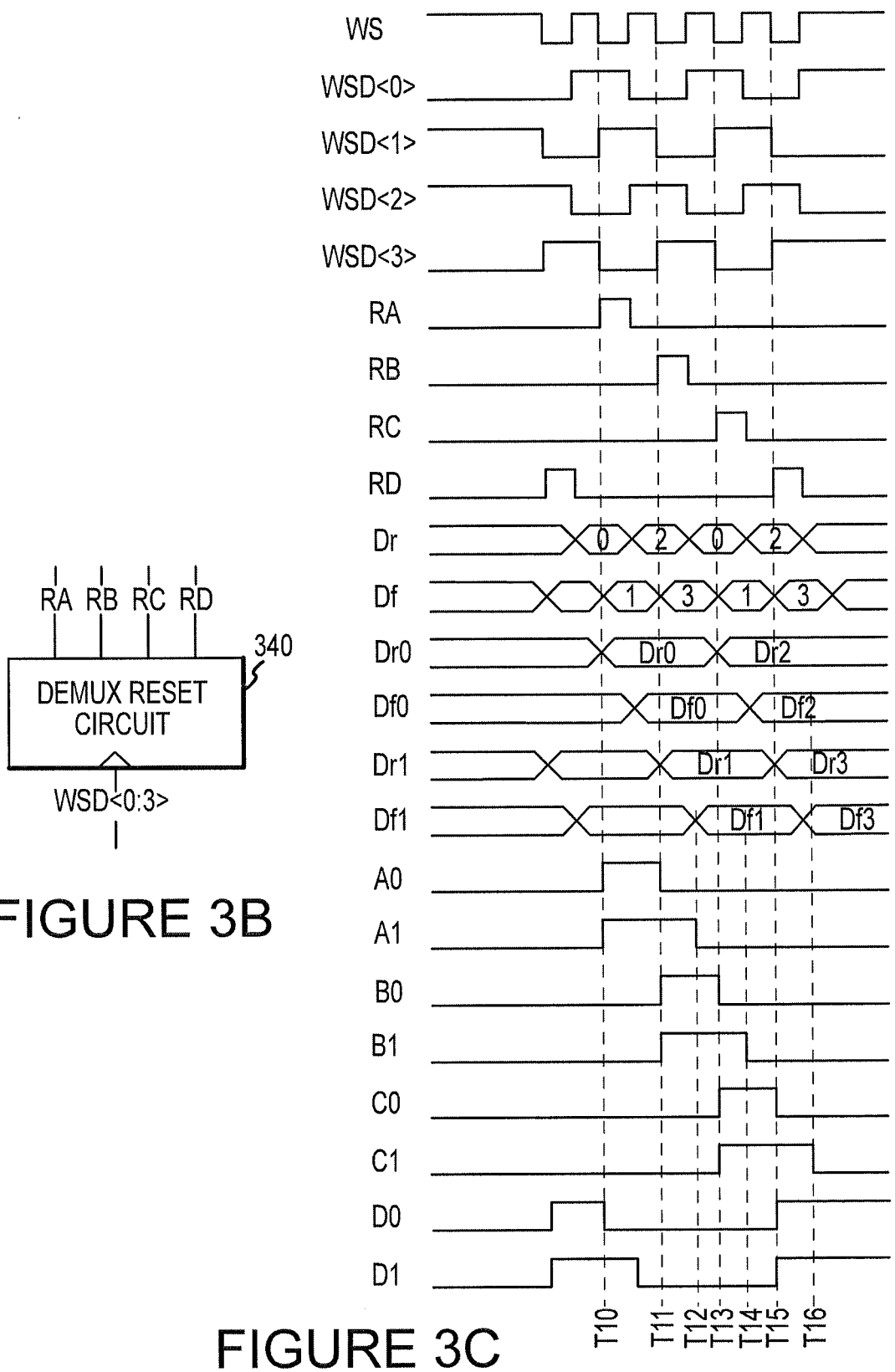
FIG. 3B is a schematic diagram of a demultiplexer reset circuit included in the write data demultiplexer circuit of FIG. 1 according to an embodiment.
FIG. 3C is a signal diagram showing the operation of the write data demultiplexer circuit of FIG. 3A.

The operation of the sample demux circuit 300 may be described with respect to a signal diagram shown in FIG. 3C. The WS signal shown represents the received write strobe signal that toggles responsive to a write command signal. The 4-phase divided WSD<0:3> signals, generated from the WS signal, is shown next followed by the reset signals RA, RB, RC and RD. The rising edge data Dr and falling edge data Df are shown as being further divided, as previously explained, however in the interest of brevity the manner in which the Dr and Df data are generated will not be described again. The output signals A0-D1 of the Muller gates 313-316 are also represented.

In operation, the reset pulses are generated responsive to the WSD <0:3> signals. At time T10, the RA signal is generated as a pulse by the demux reset circuit 340 responsive to the WSD<1> and WSD<2> signals being high. The RA pulse cause to the Muller gate 314A,B outputs A0, A1 to transition high at time T10, and the corresponding latches 325C,D are ready to receive data. At time T11, as the Dr0 becomes valid in the corresponding flip-flop 232B of the data capture latch 200, the data is received by the latch 325C and the Muller gate 314A closes the latch. In sequence, as the next data Df0 becomes available by the data capture latch 200, the next latch 325D receives the Df0 data at time T12 and the Muller gate 314B closes the latch 325D. The next reset pulse RB has already been generated at time T11 to prepare the next set of latches 325E,F, indicated by the B0, B1 signals transitioning high, to capture the remaining bits of data in the burst sequence. At time T13, the data Dr1 becomes valid and is captured by the latch 325E, and the corresponding Muller gate 315A is closed indicated by the B0 signal transitioning low. Similarly, the latch 325F captures the next valid data Df1 at time T14 and the latch 325F is closed when the B1 signal transitions low. By this time the RC pulse has been generated at time T13 to reset the latches 325G,H indicated by the outputs C0, C1 signals transitioning high. As the data in the next burst becomes available the latches 325G,H will capture the data and the Muller gates 316A,B will sequentially close the latches 325G,H at times T15 and T16 respectively. Also at time T15, the D0 and D1 signals transition high indicating the next pair of latches 325A,B being reset by the RD pulse to capture the next available pair of data Dr3, Df3, and so on.

Figure 4A:
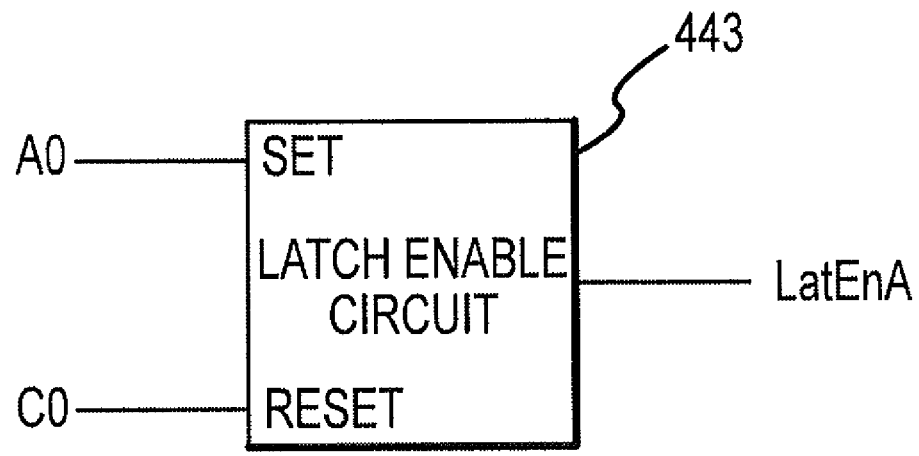
FIG. 4A is a schematic diagram of one of a plurality of latch enable circuits included in a write data demultiplexer circuit of FIG. 1 according to an embodiment.

Referring back to FIG. 1, each of the demux circuits 116, 118 operate in accordance with the signal diagram of FIG. 3C. The feedback demux circuit 118, however, includes additional circuitry to generate the latch control signals 120 that provide feedback to the write control block 124 as data is latched by the demux circuits 116. FIG. 4A shows one example of a latch enable circuit 443 designed to receive the A0 and C0 output signals from the Muller gates 314A and 316A in the feedback demux circuit 118. The latch enable circuit 443 is designed to provide a latch control signal LatEnA when the latch 325C captures data responsive to the A0 signal transitioning low. The C0 signal, when received, resets the latch enable circuit 443 since the rising edge data Dr0 is latched by only one of the A0 or C0 signals at one time.

Figure 4B:
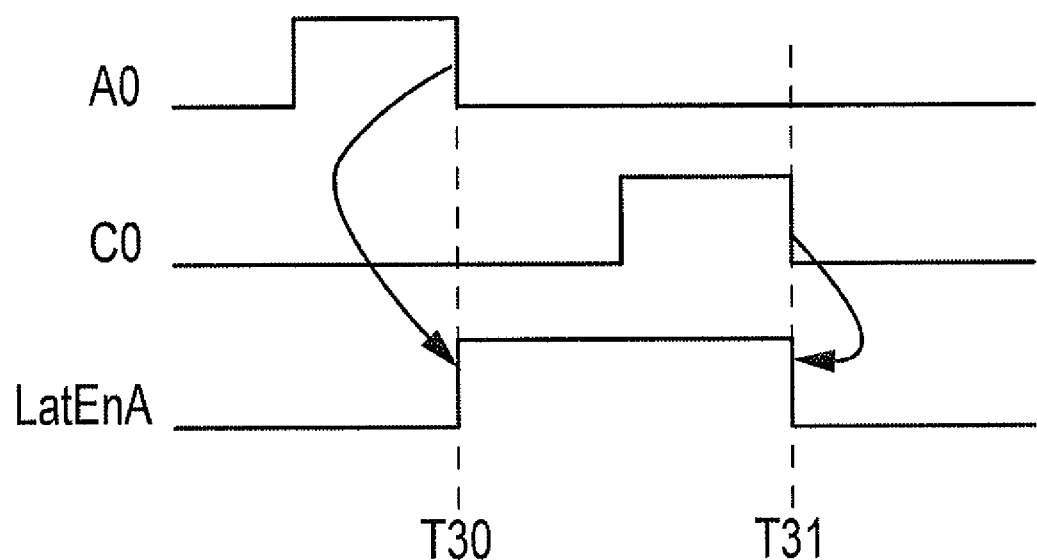
FIG. 4B is a signal diagram showing the operation of one of the plurality of latch enable circuits of FIG. 5A.

The operation of the latch enable circuit 443 is illustrated by the signal diagram shown in FIG. 4B. At time T30 the latch enable circuit 443 transitions the LatEnA control signal high responding to the first data Dr0 being captured when the A0 signal transitions low and closes the latch 325C. The high LatEnA signal indicates to the write control block 124 that the data Dr0 is captured. The latch enable circuit 443 is reset (transitions to low again) when the C0 signal transitions low at time T31.

Since there are four latches 325A, C, E, G enabled to receive rising edge data Dr0 or Dr1 in the demux circuit 116, 118 (responsive to control signals A0, B0, C0, D0), three additional latch enable circuits (not shown) are included in the feedback demux circuit 118 to track the state of the Muller circuit output signals A0-D1. Each of the latch enable circuits may be similar to the latch enable circuit 443, but configured to receive different control signals. One of the latch enable circuits (not shown) may receive the C0 signal as the set input to generate a LatEnC signal responsive to the C0 signal transitions corresponding to latch 325G, and may be reset by the A0 signal. The next latch enable circuit (not shown) may receive the B0 signal to generate a LatEnB signal that tracks the latch 325E, and may be reset by the D0 signal. The final latch enable circuit (not shown) may receive the D0 signal to generate a LatEnD signal that tracks the latch 325A, and may be reset by the B0 signal. All the latch enable circuits operate in the same manner as the latch enable circuit 443 and each are coupled to respective outputs of the Muller gates 313-316 in the feedback demux circuit 118.

Figure 5A:
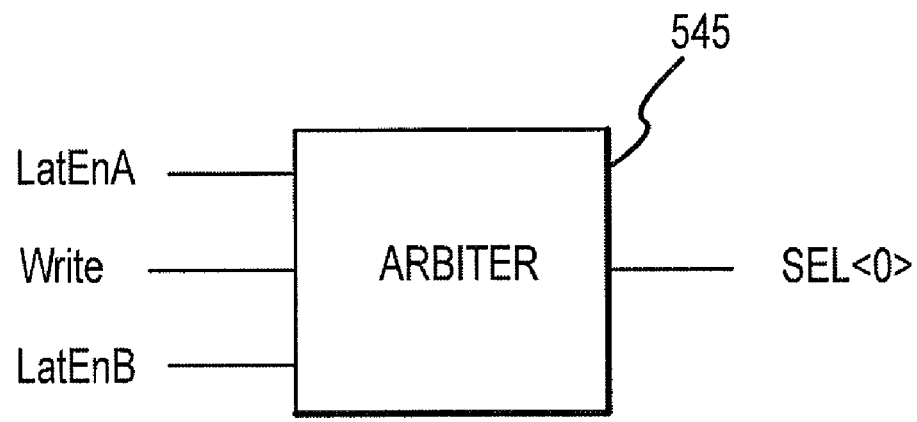
FIG. 5A is a schematic diagram of at least one arbiter circuit included in a write control block of FIG. 1.

As previously described, the latch control signals LatEnA-D are provided to the write control block 124 to determine when the data burst capture is complete. The write control block 124 compares the received latch control signals to the write latency signal that is generated relative to the external clock so that captured data may be correctly placed onto the write data bus relative to the external clock signal. The write control block 124 includes at least one arbiter circuit 545, as shown in FIG. 5A, having an output Sel<0:3> that controls the multiplexers 331 of the demux circuits 116, 118 to drive data, correctly captured, onto the write data bus. The arbiter circuit 545 shown in FIG. 5A is one example of one or more arbiters that may be utilized for comparing the LatEnA-D signals to the write latency signal. Four arbiters like the arbiter 545 may be utilized to determine the start and end of captured data by tracking when the first rising edge data is received. For example, the first arbiter 545 is shown having the first input as the LatEnA and the second input as the next latch control signal LatEnB. The LatEnA and LatEnB signals are compared to a write latency timing signal WRITE. Assuming the first data bit received caused the latch enable circuit 443 of FIG. 4 to transition the LatEnA signal high. The arbiter circuit 545 arbitrates between the rising edge of the LatEnA signal and the next available signal LatEnB to determine which signal coincides with the write timing signal. In response the arbiter circuit 545 then generates a mux select signal Sel<0> that indicates which latch first captured data in the demux circuits 116, 118, 300. The second arbiter (not shown) compares LatEnB and LatEnC to the write timing signal, the third arbiter (not shown) compares LatEnC and LatEnD to the write timing signal, and the fourth arbiter (not shown) compares LatEnD and LatEnA to the write timing signal. Only one of the latch control signals, corresponding to the latch that captured the first data bit, coincides with the write latency timing signal.

The write control block 124 is thus enabled to track when the first and last bit of the data burst is captured, which is in accordance with the states of the Muller gate output signals A0-D1. The write control block 124 compares the latch control signals to the pre-programmed write latency timing signal such that the correct data may be driven relative to external timing requirements, such as to an external clock signal. The internal write strobe need not be synchronized with the external clock signal to properly capture data during a write operation. The pre-programmed write latency may be predetermined by external circuitry relative to a system clock.

Figure 5B:
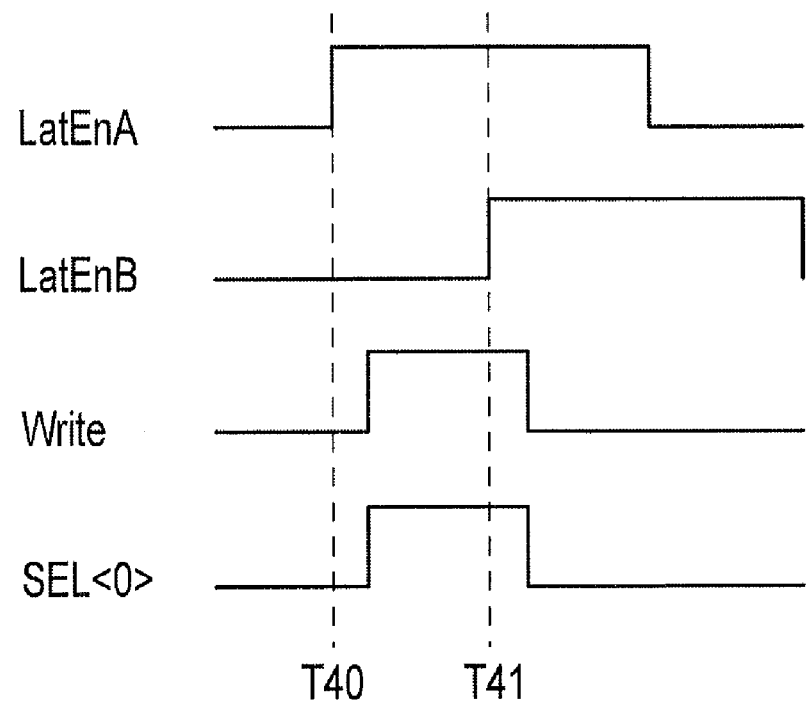
FIG. 5B is a signal diagram showing the operation of the at least one arbiter circuit of FIG. 6A.

The operation of the arbiter circuit 545 in FIG. 5A is further described with respect to the signal diagram shown in FIG. 5B. The arbiter circuit 545 compares the write latency timing signal to the rising edge of the LatEnA signal at time T40 and the rising edge of the LatEnB signal at time T41. In the example provided in FIG. 5A, the write timing signal coincides with the high signal level of the LatEnA signal and not the LatEnB signal. Therefore, correlating the LatEnA signal back to the output signals A0-D1 of the Muller gates, the write control block 124 can determine that the first data bit of the 4-bit burst was captured by the latch 325C of the demux circuits 300 responsive to the A0 signal transitioning low. Since the data is captured sequentially, the remaining bits are respectively captured by the latches 325D, 325E and 325F responsive to the A1, B0, and B1 signals sequentially transitioning low. Thus, the multiplexers 331 are accordingly selected corresponding to the arbitration outcome resulting from the write timing signal matched to LatEnA, which is Sel<0> as shown in FIGS. 5A and 5B. Each of the arbiter outputs correspond to different locations where data capture began and ended. A Sel<1> arbiter output corresponds to LatEnB matched to the write timing signal. Thus, data capture began in latch 325E responsive to the B0 Muller output signal, and counting down by four bits, the last bit was captured by latch 325H responsive to the C1 output signal. Similarly, a Sel<2> output corresponds to LatEnC being matched and therefore the first data being captured responsive to the C0 signal, and a Sel<3> corresponding to the first data being captured relative to the D0 output signal.

Figure 6:
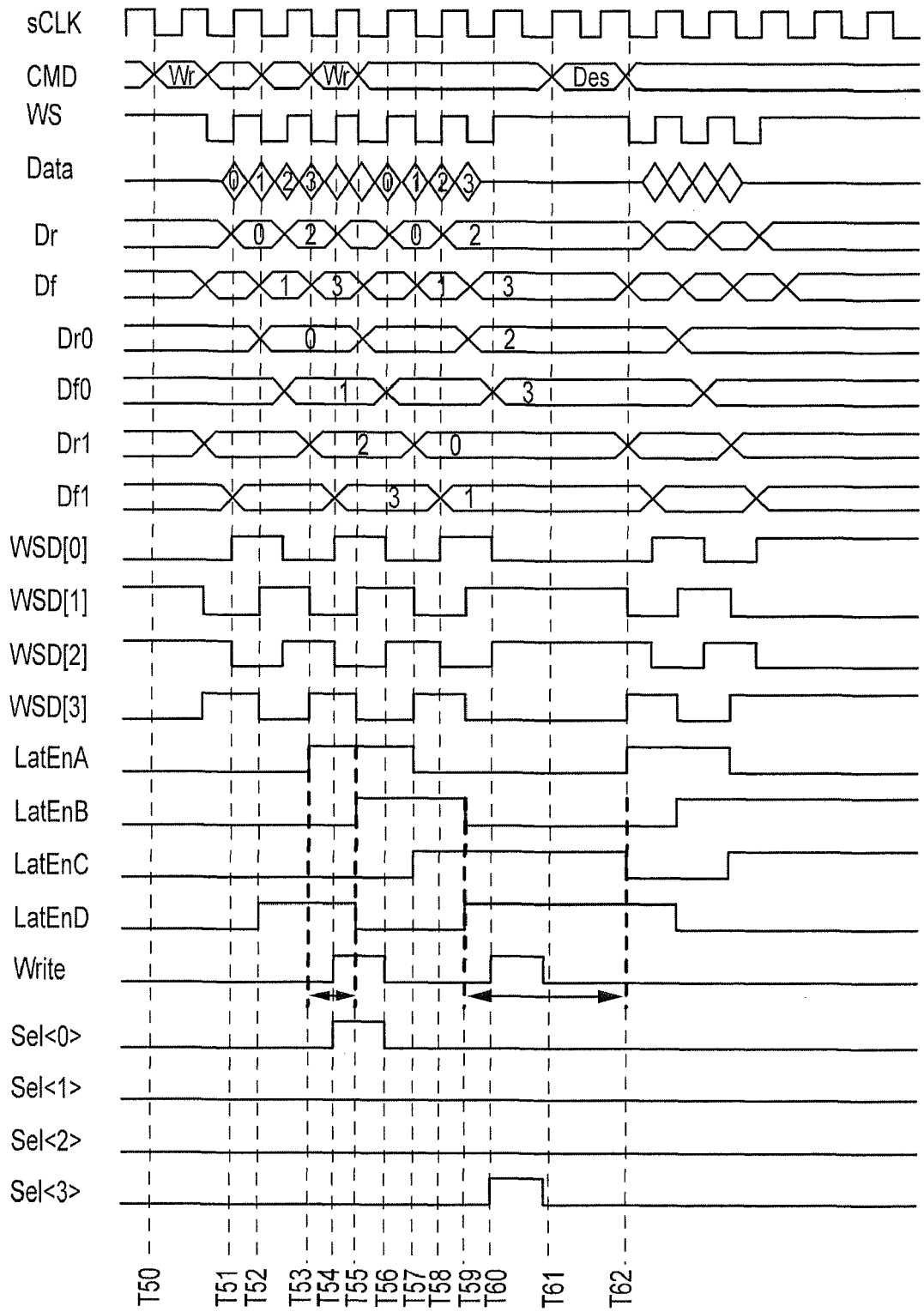
FIG. 6 is a signal diagram showing the operation of the write latency tracking system of FIG. 1.

The combined operation of the demux circuits 116, 118 and the write control block 124 can be summarized with reference to the signal diagram shown in FIG. 6. At time T50 a write command signal is issued relative to a system clock sCLK. In response to the write command signal, the write strobe signal begins to toggle as a first data burst is received on the DQ pad having four bits "0-3" starting at time T51. The data capture latches 112 receives each bit relative to the rising and falling edges of the WS signal to phase-split the data between times T51 and T54 into rising edge data Dr and falling edge data Df. As previously described, the WS signal is divided into 4-phase clock signals WSD<0:3>, which are applied to the data capture latches 112 to further phase-split the data between T52 and T58 to be latched by the demux circuits 116, 118 relative to the WSD<0:3> signals. For example, the first rising data bit Dr is phase-split on the first rising edge of WSD<1> at time T52 and latched to a rising edge flip-flop as Dr0 in the data capture latch 112. The first data Dr0 is then captured by the demux circuits 116, 118, which cause the corresponding latch enable circuit 443 in the feedback demux circuit 118 to transition the LatEnA signal high at time T53. A write timing signal is generated at time T54 having a preprogrammed write latency responsive to the write command signal generated relative to the system clock at time T50. Each of the arbiters 545 compare the write timing signal to respective rising edges of the latch control signals LatEnA-D. As in the example provided in FIG. 6, the write timing signal coincides with LatEnA and LatEnB signals between times T53 and T55. Since LatEnA transitions high first, indicating the location of the first data bit captured in the demux circuits 116, 118, the feedback demux circuit 118 signals the corresponding arbiter 545 in the write control block 124. The arbiter 545 generates the Sel<0> at time T54 to drive the multiplexers in the demux circuits 116,118 accordingly.

When the next write command is received at time T53, the second data burst that is received is processed in the next available latches of the demux circuits 116, 118. The write control block 124 is capable of tracking received bits independent of the external clock sCLK despite the lapse of data bits being received between data bursts which causes a gap at times 54, 55. The first data bit in the second data burst is captured when it is made available by the data capture latch 112 at time T57 and latched by the demux circuits 116, 118 at time T59. Since the capture of the first data bit of the second data burst corresponds to the LatEnD signal, which is determined independent of the sCLK signal, the LatEnD signal is matched to the second write timing signal provided at time T60. In response, the respective arbiter 545 generates the Sel<3> signal at time T60 to drive the correct data onto the write data bus. Thus, the combined operation of the data capture latch 112, demux circuits 116, 118 and the write control block 124 independently tracks the data being captured to be driven onto the write data bus and later correlates driving the captured data relative to the system clock when all the data is made available.

Figure 7:
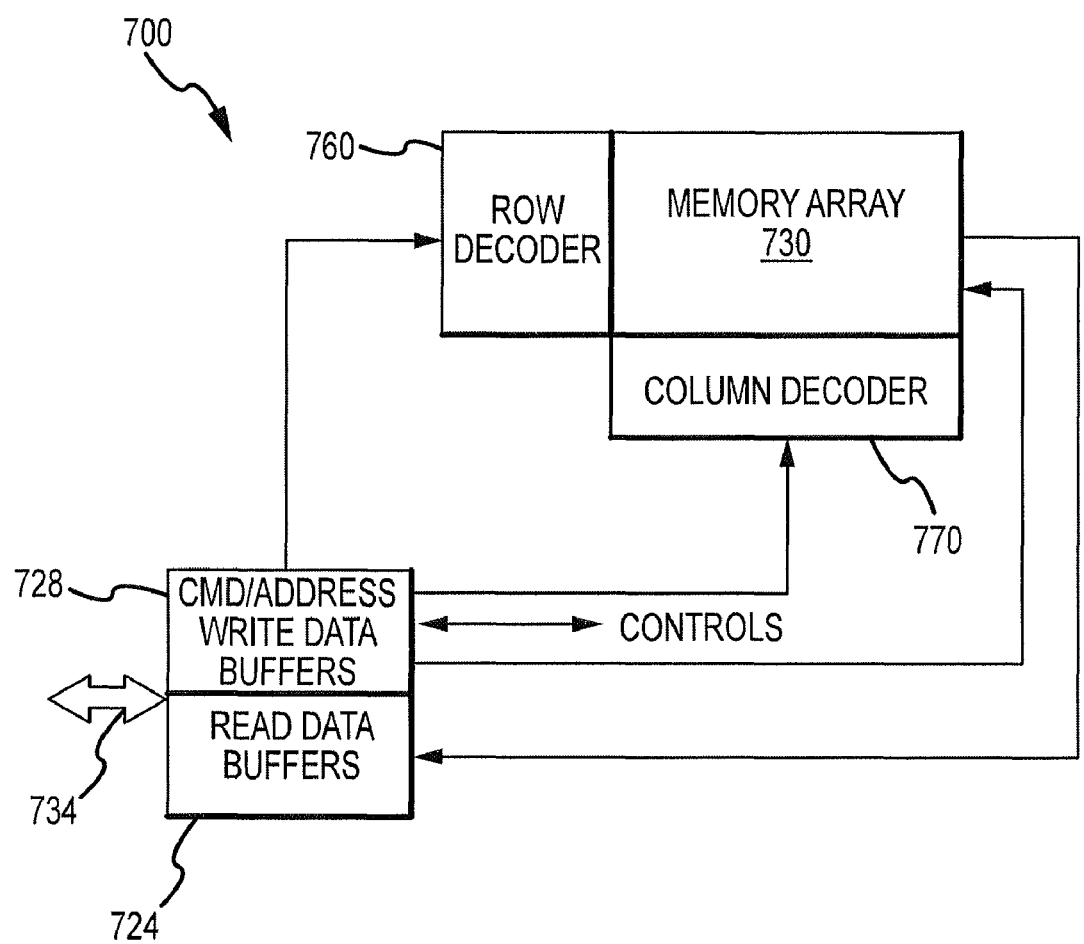
FIG. 7 is a block diagram showing a memory device having a write latency tracking system according to embodiments of the invention.

FIG. 7 is a functional block diagram of a memory device 700 having drivers that include the output driver circuits in accordance with the embodiments previously described. The memory device 700 in FIG. 7 includes a synchronous dynamic random access memory ("SDRAM") or a reduced latency dynamic random access memory (RLDRAM), although the principles described herein are applicable to any memory device that may include output driver circuits 300, 500, 600.

The memory device 700 includes a memory array 730 of memory cells arranged in rows and columns. The memory array 730 may be accessed on a row-by-row, page-by-page or bank-by-bank basis as will be appreciated by one skilled in the art. The memory array 730 further includes a command, address and write data buffer block 728 that may receive row, column, and memory address signals over a bus 734 from some processing component (not shown) or controller (not shown), such as a memory controller. Similarly, read data signals may be received by read data buffers 724 to output read data from the memory array 730 through the bus 734. The block 728 may apply row address signals to a row decoder 760 and column address signals to a column decoder 770. The row decoder 760 activates a row of cells in the memory array 730 corresponding to decoded row address signals. Similarly, the column decoder 770 enables write data signals to be applied to selected columns corresponding to the column address signals and allows read data signals to be coupled from selected columns corresponding to the column address signals during memory read operation. The block 728 may additionally provide control and timing signals to various components of the memory device 700 for a number of performance operations. The detailed operation for generating control and timing signals is conventional, and thus, for the sake of brevity, will not be described in more detail.

The read data buffers 724 may include the smaller-sized output drivers 600, 500, 300 according to embodiments previously described or according to another embodiment of the invention. The output drivers are therefore capable of providing a substantially constant impedance across a wider range of voltages.

Figure 8:
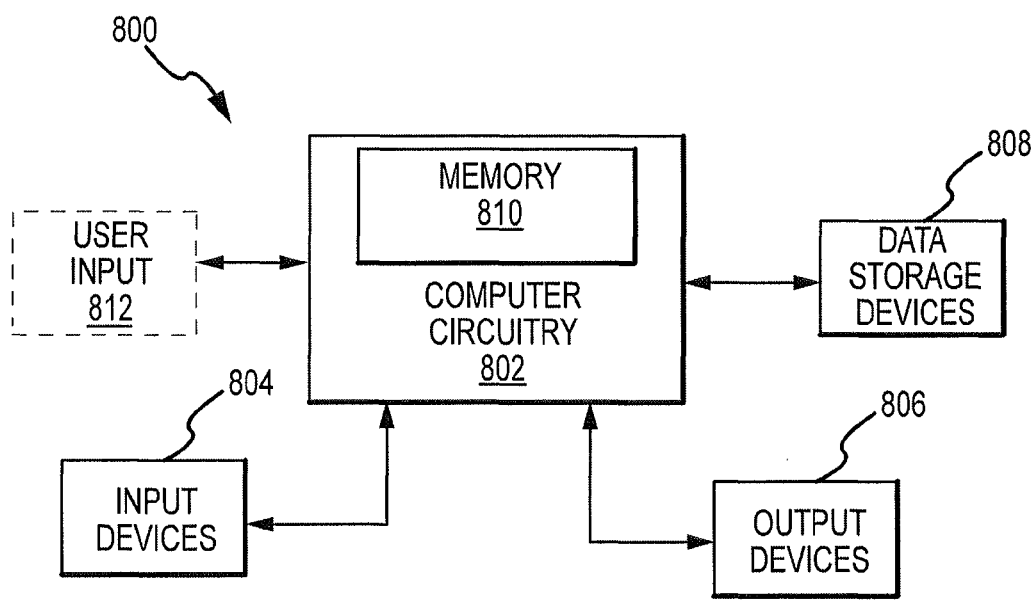
FIG. 8 is a circuit diagram of a processor-based system that includes the memory device of FIG. 7 according to embodiments of the invention.

FIG. 8 is a circuit diagram of an embodiment of a processor-based system 800 that includes the memory device 700 of FIG. 7. Conventionally, the processor circuitry 802 is coupled through address, data, and control buses to a memory device 810 to provide for writing data to and reading data from the memory device 810. The processor circuitry 802 includes circuitry for performing various processor functions, such as executing specific software to perform specific calculations or tasks. In addition, the processor-based system 800 may include one or more input devices 804, such as a keyboard or a mouse, coupled to the processor circuitry 802 to allow a user to interface with the processor-based system 800. Conventionally, the processor-based system 800 may also include one or more output devices 806 coupled to the processor circuitry 802, such as output devices conventionally including a printer and a video terminal. One or more data storage devices 808 are also conventionally coupled to the processor-based circuitry 802 to store data or retrieve data from external storage media (not shown). Examples of conventional storage devices 808 include hard and floppy disks, tape cassettes, compact disk read-only ("CD-ROMs") and compact disk read-write ("CD-RW") memories, and digital video disks ("DVDs"). Data storage devices 808 may also include non-volatile memory devices to store data that is to be retained even when power is not supplied to the processor-based system 800 or the data storage devices 808, such as a flash memory device (not shown) according to some other examples of the invention.

FIG. 8 may, for example, be a consumer device, such as a cell phone, digital camera or other hand-held device, having a user input 812 coupled to the processor 802. The processor 802 may be a microprocessor, digital signal processor, or part of a central processing unit that communicates with the user input 812 over a bus. The processor 802 may additionally have a random access memory (RAM) or, alternatively, the user input 812 may include the RAM to which the processor communicates over the bus. The user input 812 may additionally include a non-volatile storage device such as flash memory, or rely on the data storage device 808.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A data driver circuit, comprising:
   a data capture circuit configured to receive a data signal responsive to a write strobe signal, the data capture circuit configured to capture a first digit of the data signal responsive to a first edge of the strobe signal and at least a second digit of the data signal responsive to a second edge of the strobe signal; and
   a write control circuit coupled to the data capture circuit and further coupled to receive an external timing signal and the write strobe signal, the write control circuit configured to determine which digit of the data signal was latched first relative to the external timing signal, and generate a select signal to drive the first and at least second digits of the data signal latched in the data capture circuit onto a bus in the order the digits of the data signal were received.

2. The data driver circuit of claim 1 wherein the write strobe signal comprises a discontinuous clock signal and the external timing signal comprises a continuous clock signal.

3. The data driver circuit of claim 1 wherein the write control circuit comprises a clock divider circuit coupled to receive the write strobe signal and coupled to the data capture circuit, the clock divider circuit configured to divide the write strobe signal to generate a plurality of write strobe signals, each of the plurality of write strobe signals having a different clock phase relative to each other.

4. The data driver circuit of claim 3 wherein the data capture circuit comprises:
   a plurality of data capture latches coupled to receive the plurality of write strobe signals and each digit of the received data signal, the plurality of data capture latches configured to phase-split a corresponding clock signal of the plurality of divided write strobe signals the plurality of data capture latches between rising edge data and falling edge data; and
   a plurality of demultiplexer circuits coupled respectively to the plurality of data capture latches and to the bus, each of the plurality of demultiplexer circuits further coupled to receive the plurality of write strobe signals having different phases, and configured to latch and track the digits of the received data signal.

5. The data driver circuit of claim 4 wherein the plurality of demultiplexer circuits comprise a plurality of Muller gates each having an output coupled to a respective latch in the plurality of data capture latches, the plurality of Muller gates configured to close the respectively coupled latch responsive to the latch receiving a corresponding digit of the data signal and responsive to a logic transition of the Muller gate output.

6. The data driver circuit of claim 5 wherein the plurality of Muller gates are further configured to receive a reset signal from a reset circuit in the write control circuit, the reset circuit operable to generate the reset signal responsive to at least one of the plurality of clock signals having different phases.

7. The data driver circuit of claim 1, wherein the data capture circuit is further configured to provide a latch control signal to the write control circuit relative to when each digit of data signal is captured.

8. A data driver circuit, comprising:
a data latch circuit coupled to a bus and configured to latch write data based, at least in part, on a clock signal;
a demultiplexer control circuit coupled to the data latch circuit and configured to capture the latched write data responsive to the clock signal; and
a write control circuit coupled to the demultiplexer control circuit and configured to receive a plurality of latch signals, the write control circuit further configured to provide a plurality of output signals to the demultiplexer control circuit based, at least in part, on a plurality of latch signals;
wherein the demultiplexer control circuit is configured to provide the latched write data to a bus in an order the latched write data was captured responsive, at least in part, to receipt of the plurality of output signals.

9. The data driver circuit of claim 8, further comprising:
a clock divider coupled to the data capture circuit and the demultiplexer control circuit and configured to provide the clock signal, wherein the clock signal is based, at least in part, on a write strobe signal.

10. The data driver circuit of claim 8, further comprising:
an input path coupled to the data latch circuit and configured to delay the write data.

11. The data driver circuit of claim 8, wherein the demultiplexer control circuit is configured to provide the plurality of latch signals responsive, at least in part, to capturing the latched write data.

12. The data driver circuit of claim 11, wherein the write control circuit is further configured to provide the plurality of output signals based, at least in part, on an external clock signal.

13. The data driver circuit of claim 8, wherein the write control circuit is further configured to determine the order in which the latched write data was captured by the demultiplexer control circuit.

14. The data driver circuit of claim 8, wherein the data latch circuit is configured to capture the write data based, at least in part, on rising and falling edges of the clock signal.

15. The data driver circuit of claim 8, wherein the data latch circuit is configured to phase split the respective write data.

16. A data driver circuit, comprising:
a plurality of data latch circuits each configured to latch a respective data signal responsive to a clock signal;
a plurality of demultiplexer control circuits each coupled to a respective one of the plurality of data latch circuits and configured to capture the respective latched data signal responsive to the clock signal;
wherein one of the plurality of demultiplexer control circuits comprises a feedback demultiplexer control circuit and is configured to generate a plurality of latch control signals responsive, at least in part, to capturing the respective latched data signal, wherein each of the plurality of demultiplexer control circuits is configured to provide the respective latched data signal to a bus based, at least in part, on a timing of the plurality of latch control signals relative to an external clock signal.

17. The data driver circuit of claim 16, wherein each of the plurality of data latch circuits is configured to capture the respective data signal based, at least in part, on rising and falling edges of the clock signal.

18. The data driver circuit of claim 16, further comprising:
a clock divider coupled to each of the plurality of data capture circuits and configured to provide the clock signal, wherein the clock signal is based, at least in part, on a write strobe signal.

19. The data driver circuit of claim 16, wherein each of the plurality of data latch circuits comprises a latch configured to phase split the respective data signal.

20. The data driver circuit of claim 16, wherein each of the plurality of demultiplexer control circuits is configured to provide bits of the respective latched data signal in an order determined by a write control circuit.

* * * * *